United States Patent [19]

Tsuge et al.

[11] Patent Number: 4,548,834
[45] Date of Patent: Oct. 22, 1985

[54] METHOD OF PRODUCING A JOSEPHSON TUNNEL BARRIER

[75] Inventors: Hisanao Tsuge; Takayoshi Yoshida, both of Tokyo, Japan

[73] Assignee: NEC Corporation, Tokyo, Japan

[21] Appl. No.: 499,553

[22] Filed: May 31, 1983

[30] Foreign Application Priority Data

| May 31, 1982 | [JP] | Japan | 57-92748 |
| May 31, 1982 | [JP] | Japan | 57-92749 |
| May 31, 1982 | [JP] | Japan | 57-92750 |
| May 31, 1982 | [JP] | Japan | 57-92751 |
| May 31, 1982 | [JP] | Japan | 57-92752 |
| May 31, 1982 | [JP] | Japan | 57-92753 |
| May 31, 1982 | [JP] | Japan | 57-92754 |

[51] Int. Cl.$^4$ .................. H01L 39/22; H01L 39/24
[52] U.S. Cl. .................. 427/63; 427/99; 427/248.1; 427/250; 427/255.4; 427/255.7; 156/643; 156/649; 156/656; 156/659.1
[58] Field of Search ............... 427/62, 63, 99, 248.1, 427/250, 255.4, 255.7; 156/643, 649, 656, 659.1

[56] References Cited

U.S. PATENT DOCUMENTS

| 4,075,756 | 2/1978 | Kircher et al. | 427/63 |
| 4,123,565 | 10/1978 | Sumitomo et al. | 427/99 |
| 4,181,755 | 1/1980 | Liu et al. | 427/99 |
| 4,418,095 | 11/1983 | Young et al. | 427/99 |
| 4,421,785 | 12/1983 | Kroger | 427/63 |
| 4,432,134 | 2/1984 | Jones et al. | 427/62 |

OTHER PUBLICATIONS

Forster et al., IBM Tech. Dis. Bul., vol. 18, No. 8, Jan. 1976, p. 2646.
Broom et al., IBM J. Res. Develop., vol. 24, No. 2, Mar. 1980.
Mohr et al., IBM Tech. Dis. Bul., vol. 23, No. 12, May 1981, pp. 5574-5575.
Webster's New Collegiate Dictionary ©1975, G. and C. Merriam Co., Springfield, Mass., p. 1161.

Primary Examiner—Richard Bueker
Attorney, Agent, or Firm—Burns, Doane, Swecker and Mathis

[57] ABSTRACT

A method for producing multi-layered Josephson tunnel barrier devices without an edge step between the layers comprises the steps of forming a first layer containing at least a lower layer superconducting film on a substrate, selectively removing the surface portion of the first layer, except an area where a Josephson tunnel barrier is to be formed, to a predetermined first depth, and forming a first insulating film, preferably by a high-directivity film forming method, on the removed portion of the first layer in such a thickness that the insulating film surface is substantially coplanar with the surface of the retained area of the first layer. A tunnel barrier may be subsequently formed after the third step or in advance following formation of the first layer in the first step, thereby eliminating a change in the characteristics of the tunnel barrier due to the atmosphere. Prevention of edge step is enhanced by forming a lower layer superconducting film on the substrate, patterning the lower layer superconducting film to form a first superconducting electrode, forming a first insulating film having a predetermined thickness over the entire area of the substrate, and selectively removing a surface portion of the first superconducting electrode except a predetermined portion thereof and a surface portion of the first insulating film such that any edge step between the boundary of the first superconducting electrode and the first insulating film is eliminated.

12 Claims, 48 Drawing Figures

METHOD OF PRODUCING A JOSEPHSON TUNNEL BARRIER

BACKGROUND OF THE INVENTION

This invention relates to a method of producing a Josephson tunnel barrier and more particularly to improvements therein which increase pattern accuracy and eliminate an edge step in a multi-layered film.

In forming a logic circuit or a memory circuit using Josephson junctions, it is necessary to reduce the variance of the critical current values, that is, the maximum current values flowing in tunnel junctions under the zero-voltage state. The critical current value varies with the area of the tunnel junction (barrier), its thickness and its physical properties. As the device size has been reduced and its density has been increased in recent years, a technique of improving the pattern accuracy of the area of the tunnel barrier has become particularly important.

A tunnel-barrier type Josephson junction device consists of a multi-layered film deposited by an evaporation or sputtering process. A method of producing such a device is described in detail, for example, in the article entitled "Fabrication Process for Josephson Integrated Circuits" by J. H. Greiner et al, IBM Journal of Research and Development, Vol. 24, No. 2, pages 195–205, March, 1980. This article reports that when a logic circuit or a memory circuit is fabricated, the multi-layered film formed on the substrate has approximately 14 layers and a total thickness of at least 3 $\mu$m. Techniques for eliminating edge step in the multi-layered film are, therefore, of great importance. Unless edge step is eliminated, step coverage would become insufficient at the pattern edge portion, causing deficiencies in various device characteristics, such as a discontinuity in the superconducting electrode and the creation of a short-circuit between the superconducting electrodes despite the interposed insulating layer. Specifically, in comparison with other devices such as semiconductor devices, the Josephson junction device has an extremely small power disipation and hence, a three-dimensional structure device has been proposed in which a plurality of Josephson junction devices are arranged in a direction perpendicular to the substrate. Such a three-dimensional device can not be fabricated readily without edge step elimination techniques.

The following three methods are known in the prior art for fabricating the Josephson integrated circuits, and the following description will be primarily directed to methods of producing the Josephson tunnel-barrier.

In accordance with a first method, a first superconducting electrode consisting of niobium (Nb), lead (Pb) or the like is deposited on an insulating surface of a substrate by an evaporation or sputtering technique and a patterning process is then effected by selectively etching the deposited film using conventional photoresist steps or by a selective lift-off process. Next, an undercut, umbrella-like photoresist mask is formed on the portion of the first superconducting electrode where a tunnel-barrier is to be eventually formed, by soaking in an organic solvent such as chlorobenzene or bromobenzene before or after exposure in the conventional photoresist processing steps. Then, an insulating layer such as silicon monoxide SiO and silicon dioxide $SiO_2$ is deposited on the surface of the substrate by a film-forming technique with a high directivity, such as an evaporation technique, and a lift-off of the undercut photoresist with the insulating layer thereon is then carried out. The lift-off portion where the insulating layer is removed is oxidized by thermal oxidation or plasma-oxidization to provide a tunnel barrier having a thickness of several tens of angstroms. Thereafter, a second superconducting electrode is formed by depositing a Nb or Pb film and patterning it in the same way as the first superconducting electrode.

This method requires the formation of the undercut, umbrella-like photoresist mask and this undercut quantity is very sensitive to the pre-baking condition of the photoresist, the liquid temperature of the organic solvent and the soaking time. Accordingly, it is extremely difficult to control the pattern size of the bottom area of the photoresist mask, which effectively determines the area of the tunnel barrier. Moreover, because the surface of the portion where the tunnel barrier is formed is located below that of the surrounding insulating layer, the side surface of this insulating layer is likely to be sputtered during plasma cleaning and plasma oxidation and the sputtered insulating materials attach to and contaminate the surface of the tunnel barrier portion, causing a further problem in addition to the aforementioned problem of the edge step.

A second method is to eliminate the degradation of the pattern accuracy due to the lift-off process using a photoresist mask. After the insulating layer of SiO or $SiO_2$ is deposited over the substrate with the patterned first superconducting electrode, a hole is opened in the insulating layer by ion etching or reactive sputter etching in accordance with conventional photolithography techniques. Thereafter, the exposed portion of the first supeconducting electrode is oxidized to form the tunnel barrier and the second superconducting electrode is formed thereon.

In this method, too, the surface of the portion for the tunnel barrier is located below that of the surrounding insulating film so that the portion is contaminated by the sputtered insulating materials from the side surface of the insulating layer during plasma cleaning and plasma oxidation. Moreover, the problem of the edge step can not be eliminated.

A third method is to improve the pattern accuracy and contamination resulting from plasma treatment. It is referred to as "SNAP (Selective Niobium Anodization Process)". Refer to H. Kroger, L. N. Smith and D. W. Jillie, "Selective niobium anodization process for fabricating Josephson tunnel junctions", Appl. Phys. Lett., Vol. 39, No. 3, Aug. 1, 1981, pp. 280–282. In accordance with this method, a three-layered film consisting of a lower layer Nb, a tunnel barrier layer and an upper layer Nb is formed and a photoresist is then formed on the portion where a tunnel barrier is to be formed. The upper layer Nb not covered by this photoresist is anodized to form the upper Nb electrode. The photoresist is thereafter removed and a Nb contact layer is formed for the upper Nb electrode.

However, the material that can be used as the electrodes in accordance with this SNAP method is limited and free choice of the material is not possible. In addition, since the volume of the upper layer Nb expands during anodization, a problem of the edge step between the surface of the upper Nb electrode on the tunnel barrier and the surface of the anodized layer remains unsolved.

SUMMARY OF THE INVENTION

It is therefore an object of the present invention to provide a method of producing a Josephson tunnel barrier device which makes it possible to form a multi-layered film devoid of an edge step.

It is another object of the present invention to provide a method of producing a Josephson tunnel barrier device high pattern accuracy.

It is still another object of the present invention to provide a method of producing a Josephson tunnel barrier device which reduces contamination during such steps as plasma treating step.

It is still another object of the present invention to provide a method of producing a Josephson tunnel device which readily achieves the foregoing objects without restriction on the electrode material which must be employed.

It is a further object of the present invention to provide a method of producing a Josephson tunnel barrier which can eliminate a short-circuit between the lower layer electrode and the upper layer electrode due to the pinholes of a tunnel barrier.

In accordance with the present invention, there is provided a method of producing a Josephson tunnel barrier which comprises a first step of forming a first layer containing at least a lower layer superconducting film on a substrate, a second step of selectively removing the surface portion of this first layer except an area where a Josephson tunnel barrier is to be formed to a predetermined first depth, and a third step of forming a first insulating film, preferably by a high-directivity film forming method on the removed portion of the first layer in such a thickness that its surface is substantially equal to the surface of the retained area of the first layer. The second and third steps may be carried out by so-called lift-off process using photoresist masks, and after these steps a tunnel barrier may be formed by plasma-oxidizing the exposed surface of the left area of the first layer, followed by formation of an upper layer superconducting film thereon. The tunnel barrier layer may be formed in advance following formation of the first layer in the first step, so that a change in the characteristics of the tunnel barrier due to the atmosphere can be eliminated. Where an oxide film is not used as the tunnel barrier layer (or where a semiconductor or a metal is used), the short-circuit between the upper and lower layer electrodes which would result due to the pin-holes formed in the tunnel barrier layer can be prevented by effecting thermal oxidation after the tunnel barrier layer is formed. When a lift-off process is used, further, the short-circuit between the upper and lower electrodes that would occur due to the absence of the first insulating film on the peripheral wall of the retained portion of the first layer where the tunnel barrier is to be formed can be prevented by effecting thermal oxidation before or after the formation of the first insulating film.

These and other objects and features of the present invention will become clearer from the following description when taken in conjunction with the accompanying drawings.

DESCRIPTION OF THE PREFERRED EMBODIMENTS

Figure 1A:
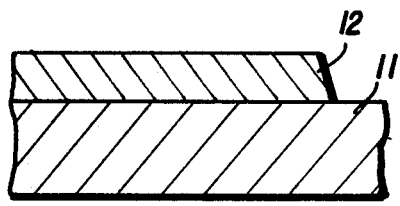
FIGS. 1A through 1F are sectional views showing the principal portions at the respective processing steps in one embodiment of the present invention.
Figure 1B:
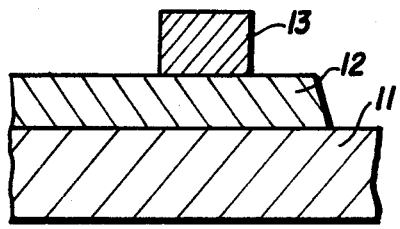
Figure 1C:
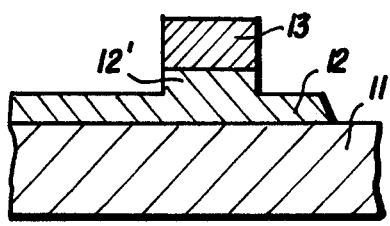

In the first embodiment of the present invention, a first superconducting electrode 12 consisting of Nb, Pb or the like is first formed on a substrate 11 of an insulator or a substrate having an insulating layer on its surface, as depicted in FIG. 1A. As a more specific example, a 4,000 Å-thick Nb film is deposited by RF sputtering on the substrate 11 consisting of a silicon (Si) body covered with a thermally oxidized $SiO_2$. The deposition is carried out at a substrate temperature of 300° C. The deposited Nb film is patterned by selective etching or lifting off using a conventional photoresist process to form the first superconducting electrode 12. In greater detail, a photoresist mask (not shown) is formed by a conventional photoresist process using a positive photoresist (AZ1350J of Shipley Co.) on the Nb film and the exposed Nb film is then etched by reactive sputter etching using Freon 12 ($CCl_2F_2$) as the etching gas, thereby forming the first superconducting electrode 12. Next, as shown in FIG. 1B, a photoresist mask 13 is formed on the portion of the first superconducting electrode 12 where a tunnel barrier is to be formed, and, as shown in FIG. 1C, the exposed portion of the first superconducting electrode 12 is partially removed by anisotropic etching such as reactive sputter etching, or ion etching to such extent that a residual film thickness greater than the well-known London penetration depth is left. In greater detail, the photoresist mask 13 has a 1.5 $\mu$m film thickness and a 2 $\mu$m diameter, is formed using AZ13505 on a portion 12' of the first superconducting electrode 12 where the tunnel barrier is to be formed. The exposed first superconducting electrode 12 is etched to a depth of 2,000 Å by reactive sputter etching using $CCl_2F_2$. The etching rate of the Nb film to AZ1350J photoresist is from 5 to 6 and the Nb film is etched anistropically. For these reasons, hardly any change in the pattern dimension occurs with respect to the photoresist mark 13. The residual film thickness at the etched portion of the first superconducting electrode 12 is 2,000 Å which is sufficiently greater than the London penetration depth of approximately 1,000 Å.

Figure 1D:
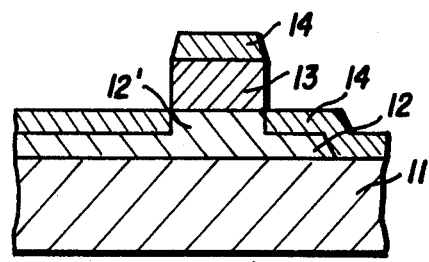

Subsequently, as shown in FIG. 1D, an insulating layer 14 of SiO, $SiO_2$ or the like is deposited on the entire surface of the substrate by film-forming methods having good directivity such as evaporation or ion beam sputtering. A lift-off process is then effected by dissolving the photoresist mark 13 and removing the insulating layer 14 on the photoresist 13 together with the photoresist 13 to expose the barrier forming portion 12' of the first electrode 12. For instance, SiO is deposited in a thickness of 2,000 Å over the entire surface of the substrate by electron beam evaporation and the photoresist mask 13 is dissolved by ultrasonic treatment in acetone.

Figure 1E:
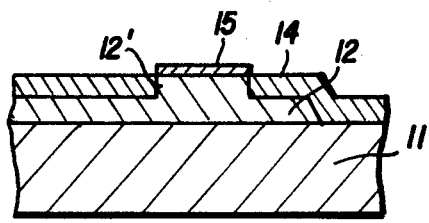
Figure 1F:
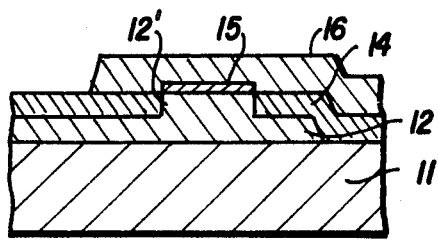

The barrier-forming portion 12' is thermally oxidized or plasma-oxidized to form a tunnel barrier layer 15 having a thickness of several tens of angstroms as shown in FIG. 1E. As shown in FIG. 1F, a second superconducting electrode 16 is then formed by evaporation or sputtering and by selective removal in the same way the first superconducting electrode 12 is formed. For example, after the surface of the barrier-forming portion 12' is cleaned by Ar plasma, a 20 to 30 Å-thick tunnel barrier layer 15 is formed by plasma oxidation using a gas mixture of pure oxygen $O_2$ and argon Ar. While vacuum is maintained, a lead-bismuth alloy (Pb-Bi) is deposited by evaporation in a thickness of 6,000 Å and is selectively lifted off to form the second superconducting electrode 16.

Although the foregoing and following embodiments of the present invention use Nb and Pb-Bi as the first and second superconducting electrodes, respectively, arbitrary combinations of Nb, Nb compounds, Nb alloys, Pb, Pb alloys may be also used. Ion etching and reactive sputter etching with an appropriate etching gas may also be used to remove the electrode materials. Although the foregoing embodiment uses AZ1350J photoresist to form the photoresist mask, it is also possible to use other organic resists, inorganic resists and etch-resistant metallic masks formed by transfer of these resists. Likewise, the second superconducting electrode is formed by the lift-off process in the foregoing embodiment but it can of course be formed by a conventional etching process. The process conditions are merely illustrative but not limitative.

In the embodiment described above, the tunnel barrier is formed on the unetched portion by anisotropical etching so that a pattern of high pattern accuracy can be obtained, thereby producing Josephson junctions with extremely low deviations in the respective critical currents. In addition, because the surface of the barrier-forming portion and that of the surrounding portion can be made flat, not only contamination of the barrier-forming portion, which occurs during plasma cleaning or plasma oxidation due to the sputter of the insulating layer materials, can be reduced, but also the aforementioned problems resulting from edge step can be overcome.

In another embodiment of the present invention, a two-layered film for the first superconducting electrode layer and the tunnel barrier layer is formed in advance. This embodiment will be described step-wise with reference to FIGS. 2A-2G in the same way as in the first embodiment. Although the second embodiment uses a semiconductor film in place of the superconducting oxide layer, the superconducting oxide film can of course be used in the second embodiment in the same way as in the first embodiment, or the semiconductor film used in the second embodiment can also be applied to the first or following embodiments.

The use of the semiconductor film for the tunnel barrier layer provides the advantages that the film thickness of the tunnel barrier layer can be controlled easily, the dielectric constant can be reduced and the surface of the superconducting layer below the tunnel barrier layer is free from ion damage. Besides Si, other semiconductors such as germanium (Ge), indium antimony (InSb), metalloids such as Te, and dielectrics such as $SiO_2$, $A_2O_3$ can also be used. If the process involves the oxidation step described below, metals typified by Al can also be used.

Figures 2A, 2E:
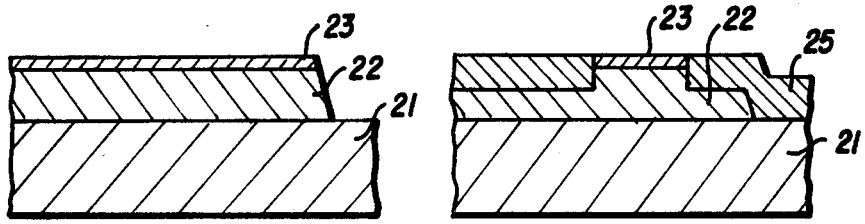
FIGS. 2A through 2G, 3A through 3F, 4A through 4G, 5A through 5G, 6A through 6F and 7A through 7I are sectional views showing the principal portions at the respective processing steps in other embodiments of the present invention.
Figures 2B, 2F:
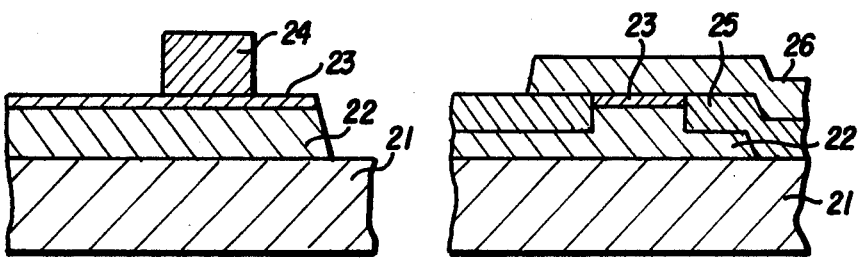
Figures 2C, 2G:
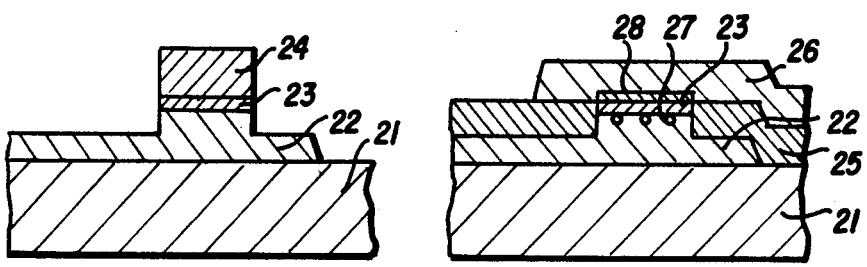
Figure 2D:
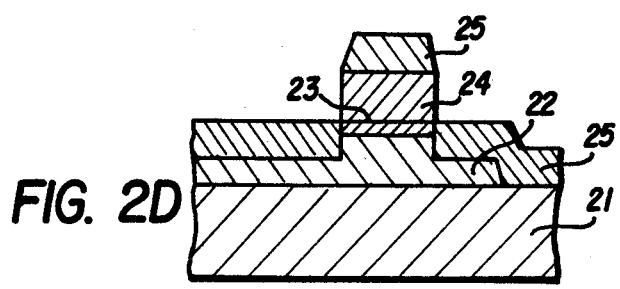

As shown in FIG. 2A, an Nb film, from which the first superconducting electrode 22 is formed, is deposited in a thickness of 4,000 Å on a $SiO_2$ layer (not shown) on a Si substrate 21, and a Si film 23 having a thickness of 30 Å is subsequently grown by plasma vapor growth using silane $SiH_4$ without exposing the substrate to the atmosphere. A photoresist mask (not shown) is formed on film 23 by a conventional photoresist, process using a positive photoresist and the first superconducting electrode 22 having the tunnel barrier layer on the surface thereof is formed by reactive sputter etching using Freon 12 ($CCl_2F_2$) as the etching gas. Next, a photoresist mask 24 having a 2 μm diameter and a 1.5 μm thickness is formed on the portion where the tunnel barrier is to be formed (see FIG. 2B) and the exposed portion of the tunnel barrier layer 23 is removed and the first superconducting electrode 22 is partially removed by reactive sputter etching using $CCl_2F_2$ (see FIG. 2C) to a depth of 2,000 Å thickness.

Next, an SiO layer 25 is deposited in a thickness of 2,000 Å over the entire surface of the substrate by electron beam evaporation (see FIG. 2D) and a photoresist lift-off process is effected by ultrasonic treatment in acetone (see FIG. 2E). After the surface of this substrate is cleaned by Ar plasma, a lead-bismuth alloy (Pb-Bi) is deposited in a thickness of 6,000 Å without breaking vacuum condition. The patterning is then carried out by conventional lift-off or photolithographic techniques to form the second superconductive electrode 26 (see FIG. 2F). After the cleaning of the surface of the barrier layer 23 by Ar plasma, plasma oxidation using the gas mixture gas of pure oxygen ($O_2$) and argon (Ar) may be carried out in order to form an oxide region 27 on the surface of the first superconducting electrode 22 below the pin hole (not shown) existing in the tunnel barrier layer 23. Numeral 28 indicates an oxide layer formed on the barrier layer 23 by the plasma oxidation. This oxidation prevents short-circuiting between the first and second superconducting electrodes 22 and 26 (see FIG. 2G).

FIGS. 3A-3F show the third embodiment of the present invention, in which a three-layered structure consisting of a lower layer superconducting electrode, a tunnel barrier layer and an upper layer superconducting electrode is formed in advance without being exposed to the atmosphere. According to this structure, the portion where the tunnel barrier layer is to be formed is not damaged by sputtering or the like and does not change its characteristics due to the atmospheres.

Referring to FIG. 3, a 3,000 Å-thick Nb film 32 is deposited on a substrate 31 by electron beam evaporation at a substrate temperature of 300° C. Niobium oxide 33 ($Nb_2O_5$) is formed in a thickness of 20 to 30 Å in succession on this Nb film inside the same vacuum chamber (not shown) by plasma oxidation using the gas mixture of pure oxygen $O_2$ and argon Ar, and an Nb film 34 (2,000 Å-thick) is continuously formed by evaporation deposition at a substrate temperature of 300° C. A photoresist mask (not shown) is formed on this film by conventional photoresist techniques using a positive photoresist, and the $Nb/Nb_2O_5/Nb$ three-layered film is etched by reactive sputter etching using Freon 12 ($CCl_2F_2$) as the etching gas to form the first superconducting electrode pattern (see FIG. 3A). Next, a photoresist mask 35 having a 2 μm diameter and a 1.5 μm thickness is formed on the portion of the three-layered film where the tunnel barrier portion is to be formed (see FIG. 3B), and the exposed portion of the upper layer Nb film 34 and $Nb_2O_5$ film 33 are completely removed by reactive sputter etching using $CCl_2F_2$ (see FIG. 3C).

Figure 3A:
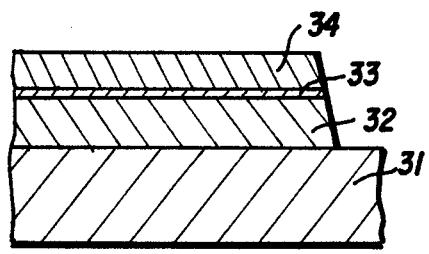
Figure 3E:
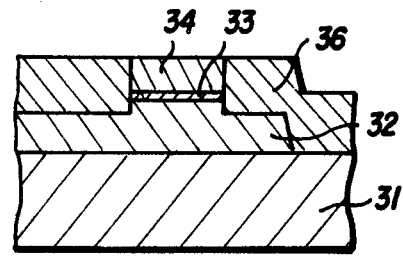
Figure 3B:
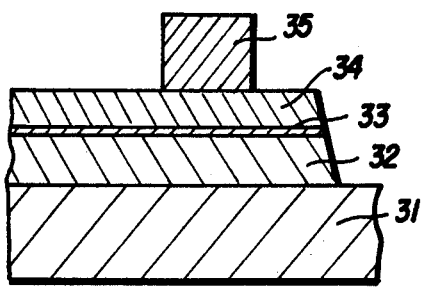
Figure 3F:
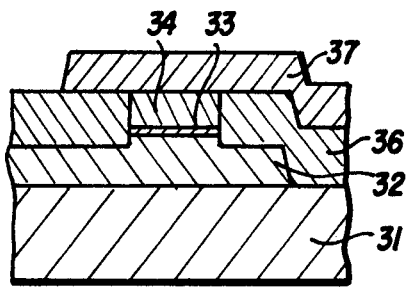
Figure 3C:
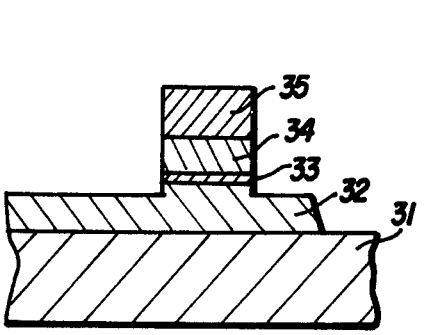
Figure 3D:
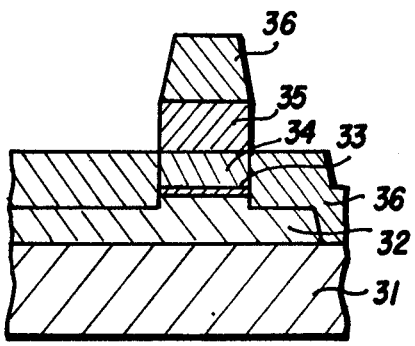

Next, SiO 36 is evaporated in a thickness of 3,000 Å over the entire surface of the substrate (see FIG. 3D), and a lift-off process is performed by ultrasonic treatment in acetone (see FIG. 3E). After the surface of the Nb film 34 on the tunnel barrier portion of this substrate is cleaned by Ar plasma, a third superconducting electrode 37 consisting of a 4,000 Å-thick Nb film is formed in the same way as in the formation of the first superconducting electrode pattern (see FIG. 3F). In this etching, since the etching rate ratio of Nb with respect to the lower layr $SiO_2$ and SiO is 6 to 7 and 3 to 4, respectively, the Nb film can be etched selectively.

FIGS. 4A–4G show still another embodiment of the present invention. This embodiment is substantially based upon the embodiment shown in FIG. 1 and can reliably prevent a short-circuit between the upper layer electrode and the lower layer electrode which would otherwise result from the arrangement wherein an insulating layer deposited by a lift-off process around the peripheral portion of the projecting first superconducting electrode is not formed in intimate contact with the peripheral wall (because of high directivity). This embodiment can be applied to all the foregoing and following embodiments.

Figure 4A:
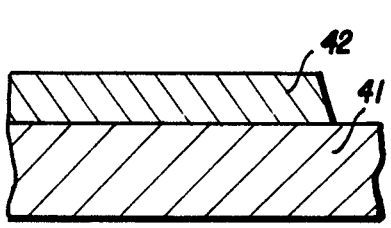
Figure 4E:
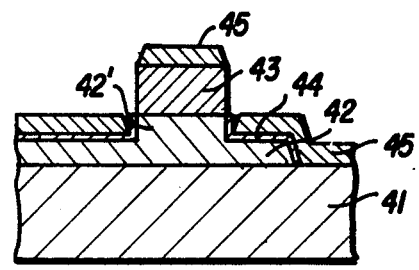
Figure 4B:
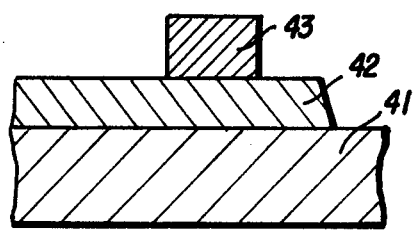
Figure 4F:
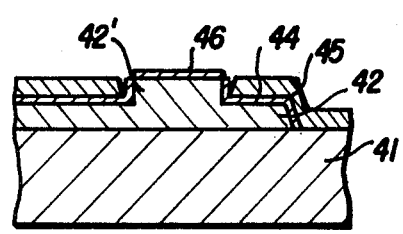
Figure 4C:
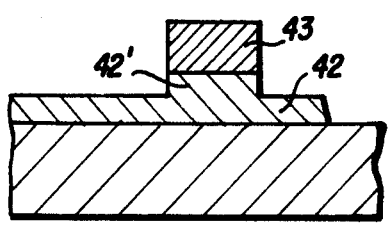

FIGS. 4A through 4C show the processing steps corresponding to those shown in FIGS. 1A through 1C, respectively. As shown in FIG. 4A, the first superconducting electrode 42 is formed on a substrate 41. The first superconducting electrode 42 is patterned by selective etching using a conventional photoresist process or a lift-off process. Next, as shown in FIG. 4B, a photoresist mask 43 is formed on the portion of the first superconducting electrode 42 where the tunnel barrier is to be formed and the first superconducting electrode 42 is partially removed anisotropically by reactive sputter etching or ion etching to the extent that a film thickness greater than the London penetration depth is left, as illustrated in FIG. 4C.

Figure 4G:
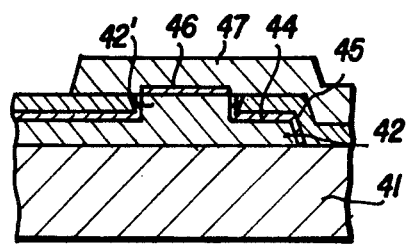
Figure 4D:
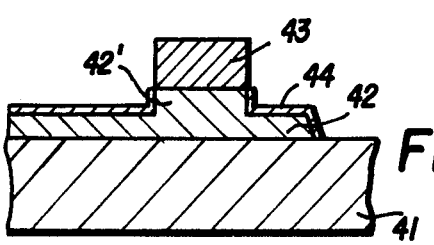

After a first insulating layer 44 is formed on the exposed surface of the first superconducting electrode 42 by thermal oxidation as shown in FIG. 4D, a second insulating layer 45 consisting of SiO or $SiO_2$ is deposited over the entire surface of the substrate by a film-forming process having high directivity such as evaporation and ion beam sputtering, as shown in FIG. 4E. The first insulating layer 44 is directed to cover the insufficiently embedded portion of the second insulating layer 45 and to reinforce its electric insulating property.

After a lift-off process is performed by dissolving the photoresist mask 43, the portion 42′ where the tunnel barrier is to be formed is thermally oxidized or plasma-oxidized so as to form a tunnel barrier layer 46 having a thickness of several tens of angstroms, as shown in FIG. 4F. Thereafter, the second superconducting electrode 47 is formed by evaporation or sputtering in the same way as in the case of the first superconducting electrode 42, as shown in FIG. 4G.

Figure 5A:
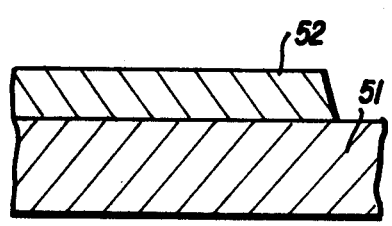
Figure 5E:
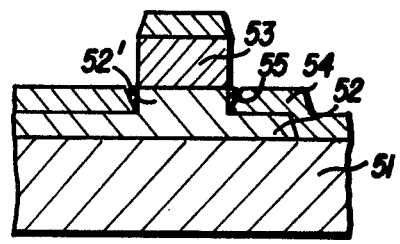
Figure 5B:
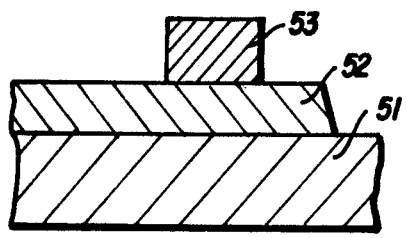
Figure 5F:
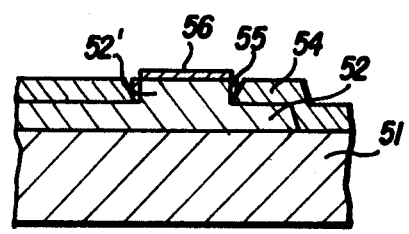
Figure 5C:
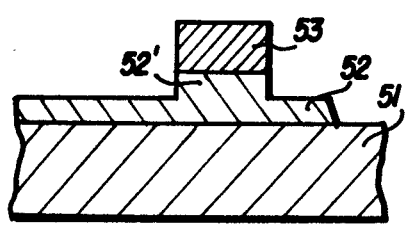
Figure 5G:
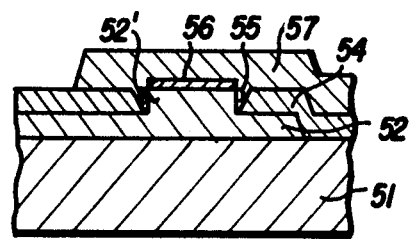
Figure 5D:
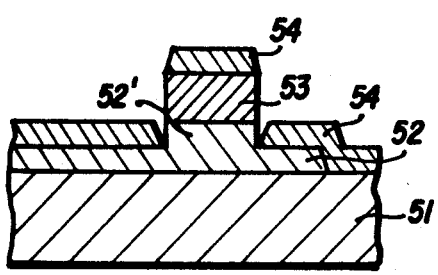
Figure 6A:
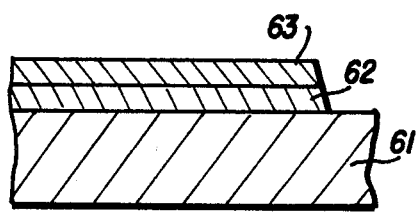
Figure 6E:
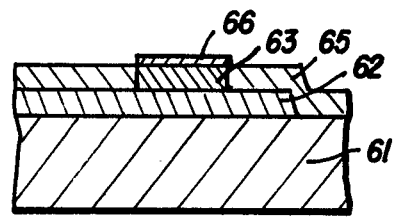
Figure 6B:
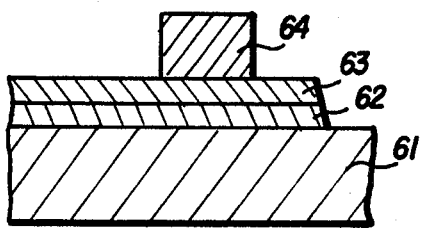
Figure 6F:
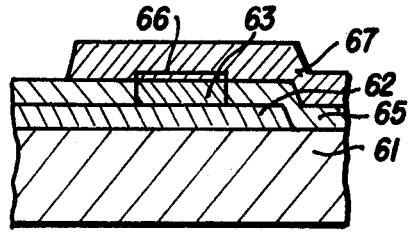
Figure 6C:
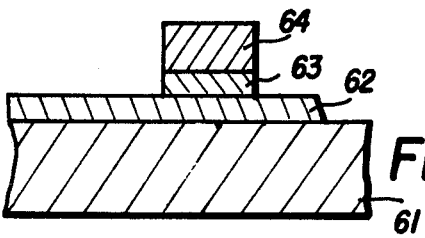
Figure 6D:
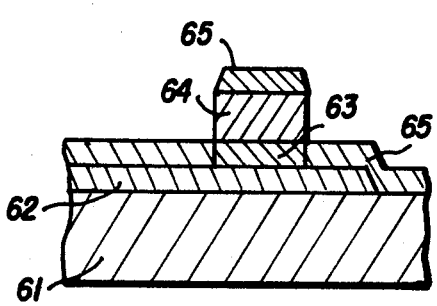

FIGS. 5A–5G show still another embodiment of the present invention which has the same object as that of the fourth embodiment. In this embodiment, a thermal oxidation film for securing the electric insulation to be formed around the periphery of the lower layer superconducting electrode is formed after the formation of an insulating film using a lift-off process. After the processing steps of FIGS. 5A through 5C corresponding to those shown in FIGS. 4A through 4C are followed, an insulating film (SiO) 54 is deposited by electron beam evaporation using a photoresist 53 as the mask (see FIG. 5D) and a thermal oxide film 55 is formed around the periphery of a portion 52′ of a first superconducting electrode 52 on a substrate 51 by thermal oxidation (see FIG. 5E). The subsequent steps shown in FIGS. 5F and 5G are carried out to form a tunnel barrier 56 and a second supeconducting electrode 57. These steps are the same as those shown in FIGS. 4F and 4G.

In each of the foregoing embodiments, the insulating film having a thickness equal to the etching depth must be deposited after the lower layer superconducting electrode is etched. For this reason, strict adjustment of the two treating conditions is necessary. Still another embodiment of the present invention shown in FIGS. 6A–6F illustrates a method which can always keep the etching depth substantially constant.

An Nb film 62 in a thickness of 2,000 Å and a gold-lead-indium alloy (Au-Pb-In) film 63 in a thickness of 2,000 Å are continuously deposited on a substrate 61 by electron beam evaporation at substrate temperatures of 300° C. and 20° C., respectively. A positive photoresist is formed on this film and the two-layered film of Nb and Pb alloy it etched by ion etching using argon (Ar) as the etching gas so as to form the patterned lower superconducting electrode (see FIG. 6A). Next, a photoresist mask 64 having a 2 μm diameter and a 1.5 μm thickness is formed on the portion of this electrode where the tunnel barrier is to be formed, and the Pb alloy film 63 is then selectively etch-removed by ion etching using Ar as the etching gas (see FIG. 6C). The etching rate ratios of the Pb-alloy film to AZ1350J photoresist and the Nb film are 11 and 15, respectively, so that the Pb alloy film can be selectively etched without causing the pattern dimension to change with respect to the photoresist mask. Next, SiO 65 is deposited in a thickness of 2,000 Å over the entire surface of the substrate by electron beam evaporation and the photoresist mask is dissolved by ultrasonic treatment in acetone pursuant to the the lift-off process. The portion of this substrate where the tunnel barrier is to be formed is plasma-cleaned in an Ar atmosphere and a 20 to 30 Å -thick tunnel barrier layer is formed by plasma oxidation using the gas mixture of pure oxygen $O_2$ and argon Ar (see FIG. 6E). While keeping vacuum, a lead-bismuth alloy (Pb-Bi) film 67 is formed by evaporation deposition in a thickness of 6,000 Å and the patterning process is then carried out to obtain an upper superconducting electrode. This upper electrode may of course be formed by conventional photolithography techniques or a lift off process as in the aforementioned embodiments. The etching depth in this instance can be easily controlled by selecting the electrode material and the etching process so that the second superconducting electrode 63 is selectively etched with respect to the first superconducting electrode 62.

FIGS. 7A–7I show still another embodiment of the present invention which can better alleviate the problem of edge step than the foregoing embodiments. In other words, although the foregoing embodiments can keep flatness between the surface of the tunnel barrier and that of the upper layer electrode, an edge step still exists at the edge of the lower layer electrode. The embodiment shown in FIGS. 7A–7I can completely remove this edge step.

In FIG. 7, a first superconducting electrode 72 consisting of Nb or Pb is deposited on a substrate 71 by evaporation or sputtering and a 1.5 m-thick photoresist mask 73 is formed on this electrode by conventional photoresist techniques. The first superconducting electrode 72 is then patterned by reactive sputter etching or ion etching as shown in FIG. 7B. A first insulating layer 74 consisting of SiO or $SiO_2$ is subsequently formed over the entire surface of the substrate by a film-forming method with high directivity such as evaporation or ion beam deposition, as shown in FIG. 7C. This film thickness is optimized as will be described later. Next, as shown in FIG. 7D, the photoresist mask 73 is dissolved and a photoresist mask 75 is formed on the portion of the first superconducting electrode 72 where the tunnel barrier is to be formed, as shown in FIG. 7E. The first superconducting electrode 72 and the first insulating layer 74 are anisotropically etched by reactive sputter etching or ion etching so as to eliminate the edge step of the boundary between them, as shown in FIG. 7F. In this case, if the first superconducting electrode is to be etched in a depth d, the film thickness $d_s$ of the first superconducting electrode 72 and the film thickness $d_i$ of the first insulating layer 74 before etching are selected so as to satisfy the following relation:

$$d_s - d_i = d(1 - r_i/r_s) \qquad (1)$$

where $r_s$ and $r_i$ are the etching rate of the first superconducting electrode 72 and the first insulating layer 74, respectively. In the present embodiment, the thickness of the residual film $d_s - d_i$ of the first superconducting electrode 72 must be greater than the London penetration depth.

Figure 7A:
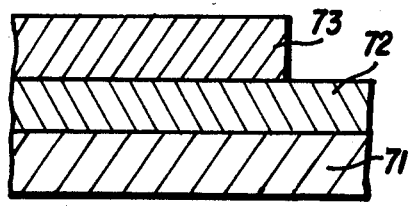
Figure 7F:
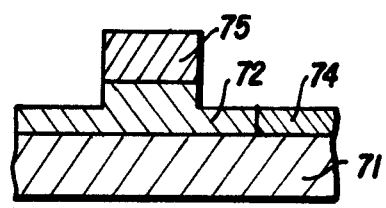
Figure 7B:
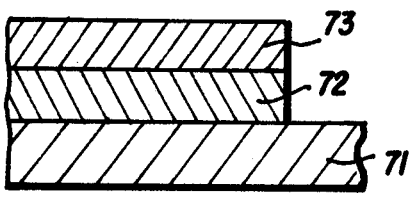
Figure 7G:
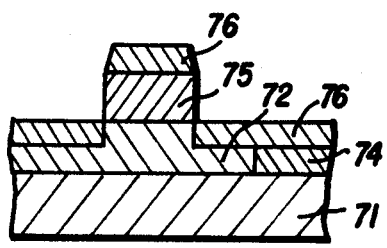
Figure 7C:
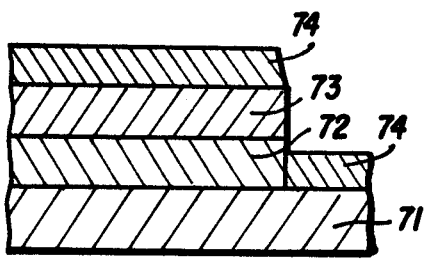
Figure 7H:
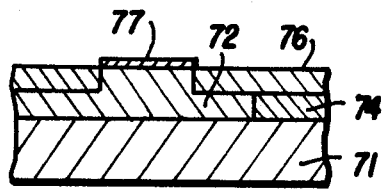
Figure 7D:
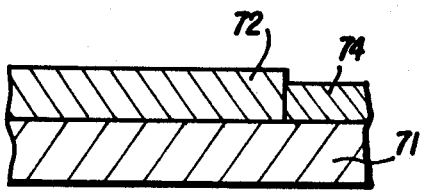
Figure 7I:
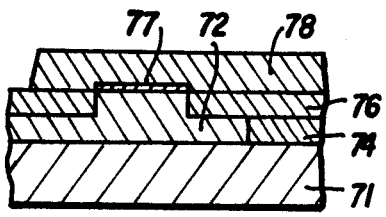
Figure 7E:
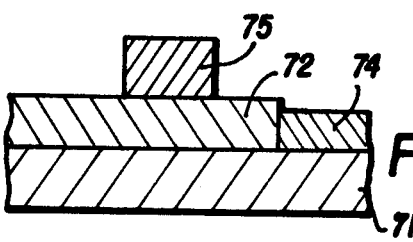

Next, as shown in FIG. 7G, a second insulating layer 76 is deposited in the same way as in the case of the first insulating layer 74. After a lift-off process is performed by dissolving a resist mask 75, thermal oxidization or plasma-oxidization is carried out to form a tunnel barrier layer 77 having a thickness of several tens of angstroms as shown in FIG. 7H. Thereafter, a second superconducting electrode 78 is formed by evaporation or sputtering in the same way as the first superconducting electrode, as shown in FIG. 7I.

Although the foregoing embodiments have been described in connection with the fabrication of devices having two superconducting electrodes, edge step in a device having a three or more-layered structure can be eliminated by repeating exactly the same method.

What is claimed is:

1. A method of producing a Josephson tunnel junction device comprising a first step of forming on a substrate a lower layer of superconducting film, a second step of selectively removing to a predetermined first depth a surface portion of said lower layer which does not include a predetermined portion of said lower layer so as to leave an exposed surface, a third step of forming a first insulating film at the exposed surface of said lower layer to a thickness such that the surface of said first insulating film is essentially coplanar with the surface of said predetermined portion, a fourth step of forming a tunnel barrier substantially coextensive with and on a surface of said predetermined portion of said lower layer, and a fifth step of forming an upper layer superconducting film on the surface of said first insulating film and on said tunnel barrier.

2. The method as defined in claim 1, wherein said second step includes a step of forming a mask on said predetermined portion and then partially removing said lower layer superconducting film to said first depth; and said third step includes a step of depositing said first insulating film by a film-forming method having high directivity on the surface of the retained portion of said first layer from which said surface portion was removed and on said mask, and a step of removing said mask.

3. The method as defined in claim 2, further comprising a step of forming, after said second step is performed, a second insulating film on the exposed surface of said lower layer, by thermal or plasma oxidation.

4. The method as defined in claim 2, further comprising a step of forming, after said second step is performed and before said third step is performed, a second insulating film on the exposed surface of said lower layer, by thermal or plasma oxidation.

5. The method as defined in claim 2, wherein performing said third step leaves an exposed portion of said surface of said lower layer adjacent said predetermined portion of said lower layer where said first insulating film is insufficiently embedded, and further comprising a step of forming, after said third step is performed, a second insulating film on said portion of said exposed surface of said lower layer.

6. The method as defined in claim 2, wherein performing said third step leaves an exposed portion of said surface of said lower layer around the periphery of said predetermined portion of said lower layer where said first insulating film is sufficiently embedded, and further comprising a step of forming, after said third step is performed, a second insulating film on said exposed portion of said surface of said lower layer around said periphery.

7. The method as defined in claim 1, wherein said fourth step is performed by thermal or plasma oxidation.

8. The method as defined in claim 1, wherein said lower and upper superconducting films consist of Nb, an Nb compound, Pb or a Pb alloy.

9. A process for fabricating a Josephson integrated circuit comprising a first step of forming a first superconducting film on a substrate and a second superconducting film on said first superconducting film, the materials of said first and second superconducting films being different and the etch rate of said second superconducting film being higher than that of said first superconducting film, a second step of selectively removing all said second superconducting film except a predetermined portion thereof, a third step of forming a first insulating film on an exposed surface of said first superconducting film, to a thickness substantially equal to that of said second superconducting film, a fourth step of forming a tunnel barrier on said predetermined portion of said second superconducting film, and a fifth step of forming a third superconducting film on the surface of said first insulating film and on said tunnel barrier.

10. The process as defined in claim 9, wherein said second step includes a step of forming a mask on said predetermined portion of said second superconducting film and then partially removing said second superconducting film to a depth equal to the thickness of said second superconducting film; and said third step includes a step of depositing said first insulating film by a film-forming method having high directivity on the surface of the retained portion of said first superconducting film from which said surface portion was removed and on said mask, and a step of removing said mask.

11. A process for fabricating a Josephson integrated circuit comprising the steps of forming a lower layer superconducting film on a substrate, patterning said lower layer superconducting film to form a superconducting electrode, forming a first insulating film having a predetermined thickness $d_i$ over an exposed surface of said substrate, selectively removing a surface portion of said first superconducting electrode except a predetermined portion thereof and a surface portion of said first insulating film such that any edge step between the boundary of said first superconducting electrode and said first insulating film is eliminated, forming a second insulating film over the area of said first superconducting electrode and said first insulating film from which said surface portions have been removed, forming a tunnel barrier on said predetermined portion of said first superconducting electrode, and forming a second electrode on the surface of said second insulating film and on said tunnel barrier.

12. The process of claim 11, wherein said surface portion of said first superconducting electrode and said surface portion of said first insulating film are removed by anisotropical etching, the removed surface portion of said first superconducting electrode has a thickness d, and the film thickness $d_s$ of said first superconducting electrode and said predetermined film thickness $d_i$ of said first insulating film have substantially the relationship $d_s - d_i = d(1 - r_i/r_s)$, where $r_s$ and $r_i$ are the etching rates of said first superconducting electrode and said first insulating film, respectively.

* * * * *